(12) United States Patent
Seddon et al.

(10) Patent No.: US 7,135,356 B2
(45) Date of Patent: Nov. 14, 2006

(54) SEMICONDUCTOR DEVICE AND METHOD OF PRODUCING A HIGH CONTRAST IDENTIFICATION MARK

(75) Inventors: Michael Seddon, Gilbert, AZ (US); Francis Carney, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 216 days.

(21) Appl. No.: 10/498,703

(22) PCT Filed: Feb. 7, 2002

(86) PCT No.: PCT/US02/03768

§ 371 (c)(1),
(2), (4) Date: Jun. 11, 2004

(87) PCT Pub. No.: WO03/073504

PCT Pub. Date: Sep. 4, 2003

(65) Prior Publication Data

US 2005/0017353 A1    Jan. 27, 2005

(51) Int. Cl.
*H01L 21/50* (2006.01)

(52) U.S. Cl. ................. 438/117; 257/E23.179

(58) Field of Classification Search ............... 438/106, 438/115, 125–127; 257/E23.179
See application file for complete search history.

(56) References Cited

U.S. PATENT DOCUMENTS

| 5,294,812 A * | 3/1994 | Hashimoto et al. .......... 257/65 |
| 5,562,993 A * | 10/1996 | Hotta ......................... 428/458 |
| 5,644,102 A * | 7/1997 | Rostoker .................... 174/547 |
| 6,113,992 A * | 9/2000 | Corbett ...................... 438/758 |
| 6,270,712 B1 * | 8/2001 | Shoji et al. ............. 264/272.17 |
| 2003/0080440 A1 * | 5/2003 | Miks et al. ................ 257/787 |

* cited by examiner

*Primary Examiner*—Scott B. Geyer
(74) *Attorney, Agent, or Firm*—Kevin B. Jackson; James J. Stipanuk

(57) ABSTRACT

A seconductor device (50) includes a semiconductor die (20) having a first surface (14) for forming electronic circuitry. A coating layer (16) formed on a second surface (15) of the semiconductor die has a color that contrasts with the color of the semiconductor die. The coating layer is patterned to expose a portion of the second surface to reveal information pertaining to the semiconductor device. The coating layer is patterned by directing a radiation beam (30) such as a laser to selectively remove material from the coating layer.

15 Claims, 5 Drawing Sheets

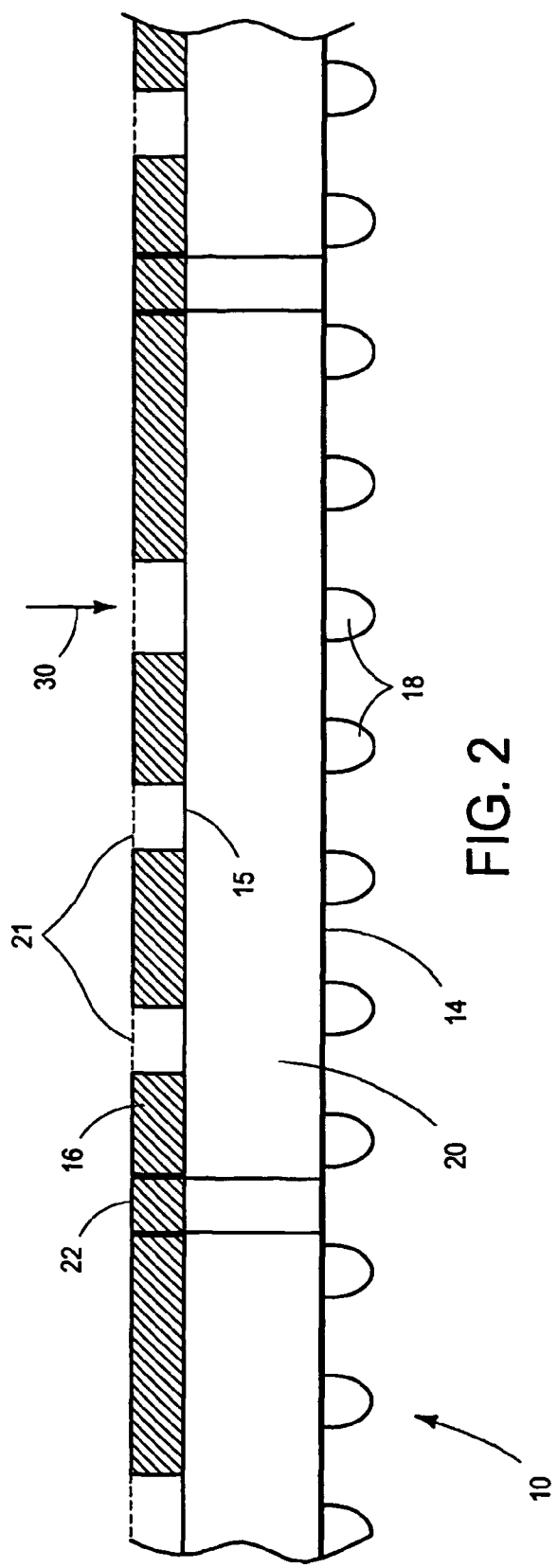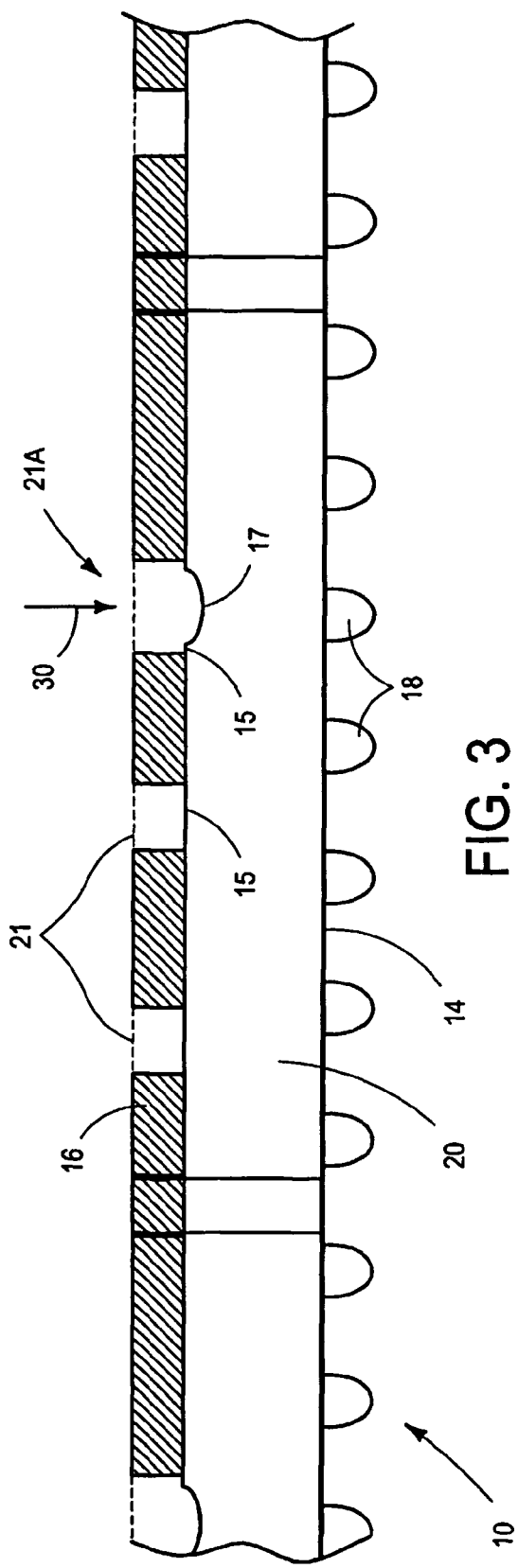

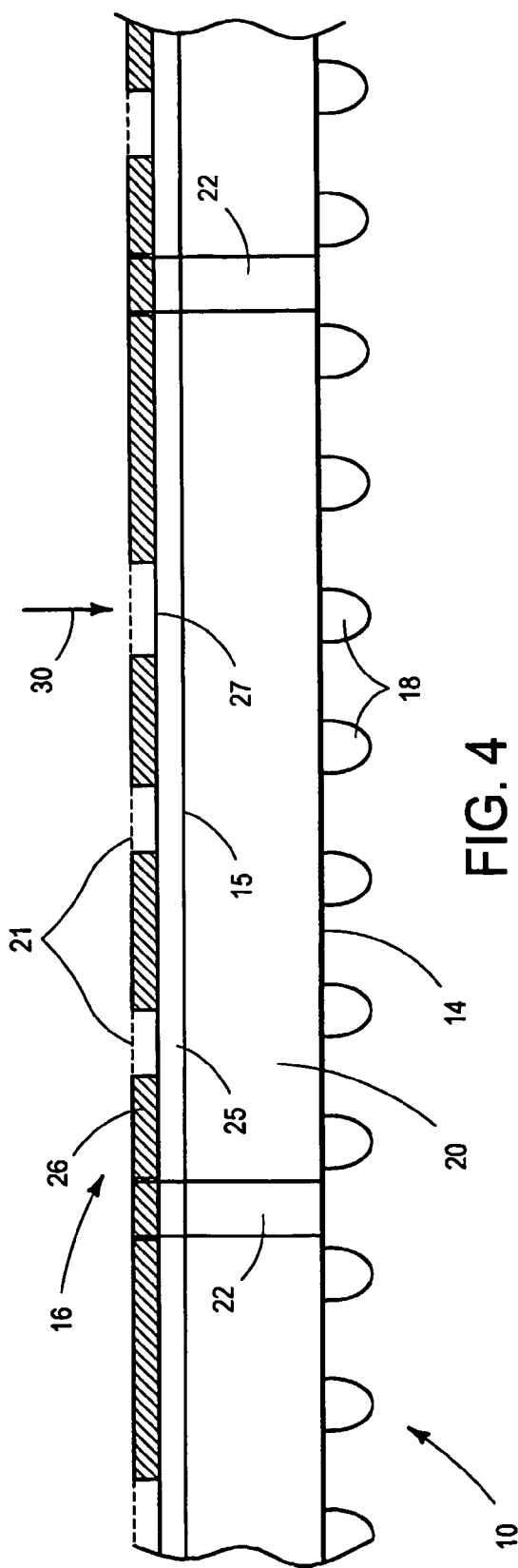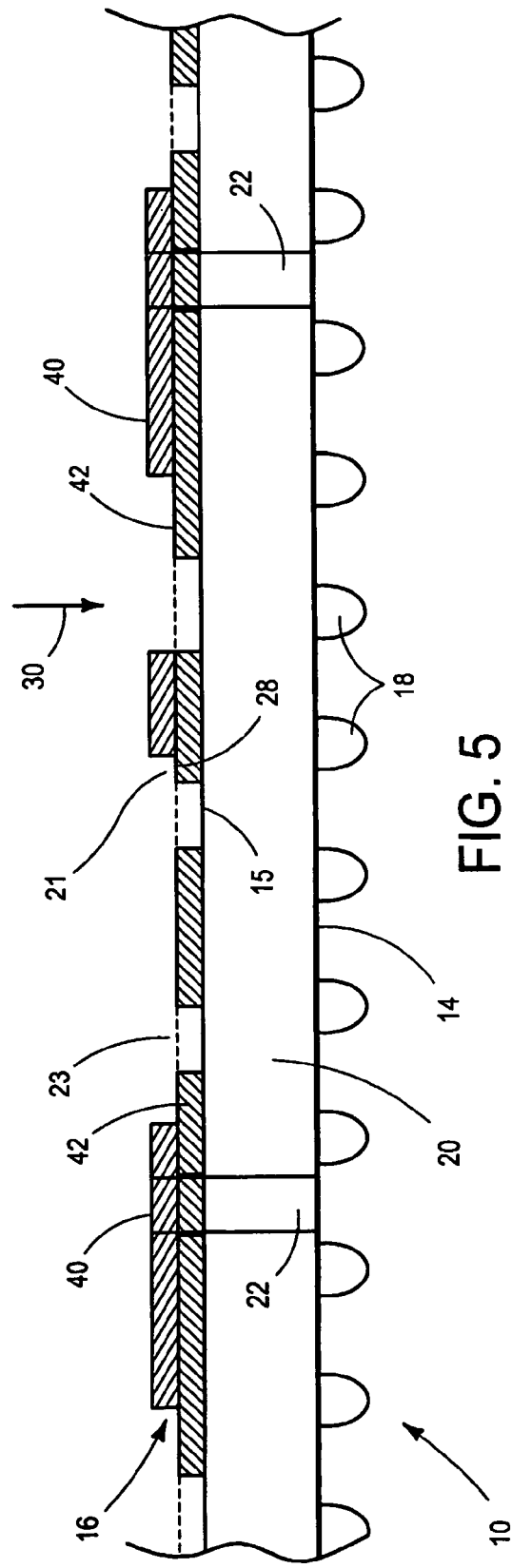

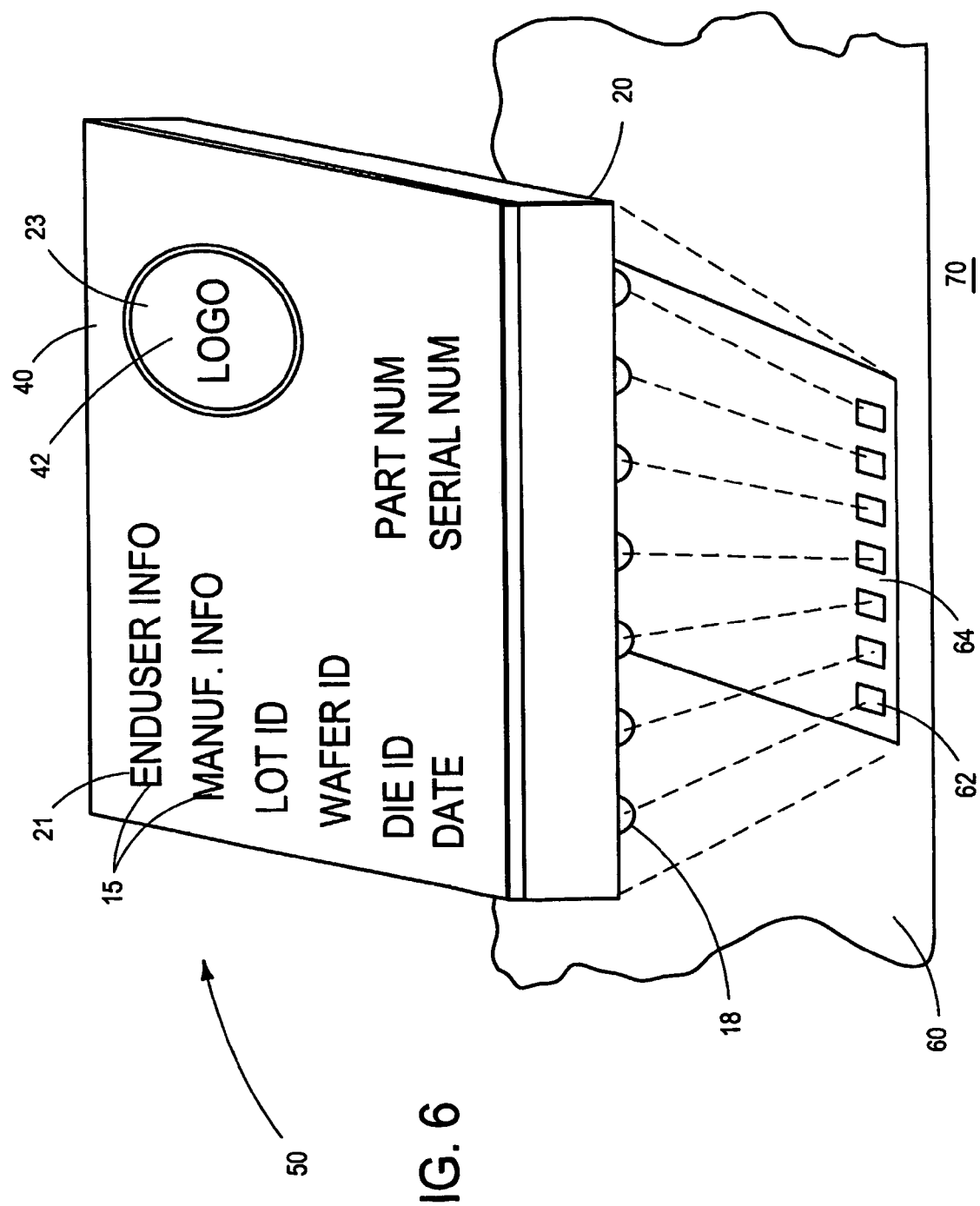

SEMICONDUCTOR DEVICE AND METHOD OF PRODUCING A HIGH CONTRAST IDENTIFICATION MARK

BACKGROUND OF THE INVENTION

The present invention relates in general to semiconductor devices and, more particularly, to semiconductor devices having a backside coating that is patterned to provide information pertaining to the semiconductor.

Electronics system manufacturers continue to demand lower cost integrated circuits and other semiconductor devices in order to reduce the cost of electronics systems. In response, many semiconductor manufacturers are providing unpackaged semiconductor dice or chips which can be mounted in a "flip-chip" fashion with the active die surface attached directly to system circuit boards. This approach reduces the direct cost of the semiconductor devices and also improves their performance by reducing lead inductance and other parasitic elements. However, the "flip-chip" technique often increases the indirect costs because such an unpackaged semiconductor chip reveals little or no information pertaining to the type of die such as its part number or manufacturer. In case of a system malfunction, it is difficult to trace a defect to a particular manufacturer or fabrication process.

To avoid this problem, some chips are fabricated with a thick backside surface coating whose surface is marked with information about the semiconductor device to facilitate tracing the device to its manufacturer in the event of a defect. Other chips use a gold coating which is etched to provide the desired pattern. However, these approaches result in the information having a low contrast and therefore low visibility, in some cases even when viewed through a microscope or other visual tool. To compensate for the low contrast, the prior art coatings are marked with large fonts, which reduces the amount of information that can be provided, especially on a small die. As a result, the ability to trace a defective semiconductor device to a specific processing step is reduced, making it more difficult to prevent future defects that could enhance the die yield and reliability to reduce the overall fabrication cost of the device and system.

Hence, there is a need for a semiconductor device and method of providing easily discernible information pertaining to the semiconductor device in order to reduce the fabrication cost and increase the reliability of the semiconductor device.

BRIEF DESCRIPTION OF THE DRAWINGS

FIG. 2 is a cross-sectional view showing further detail of a portion of the wafer;

FIG. 3 is a cross-sectional view showing the portion of the wafer in a first alternate embodiment;

FIG. 4 is a cross-sectional view showing the portion of the wafer in a second alternate embodiment;

FIG. 5 is a cross-sectional view showing the portion of the wafer in a third alternate embodiment;

FIG. 6 is an exploded view of an electrical system including a semiconductor device formed with a packaged semiconductor die singulated from the semiconductor wafer.

DETAILED DESCRIPTION OF THE DRAWINGS

In the figures, elements having the same reference number have similar functionality.

Figure 1:
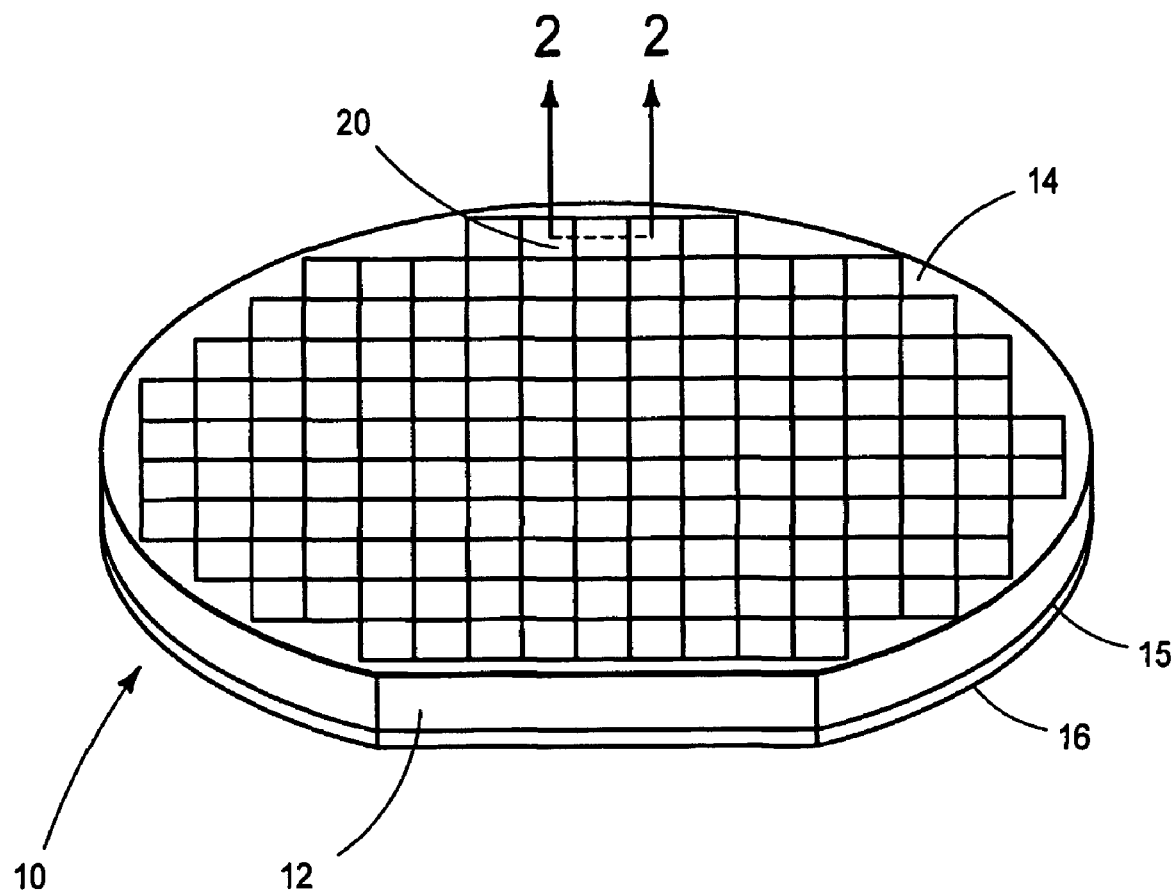
FIG. 1 is an isometric view of a semiconductor wafer.

FIG. 1 is an isometric view of a semiconductor wafer 10 fabricated to have a plurality of semiconductor dice, one of which is designated as semiconductor substrate or die 20. An active or topside surface 14 is used to form electrical circuitry that may include transistors and/or other active devices. A wafer flat 12 provides information as to the conductivity type and crystallographic orientation of wafer 10. A coating material 16 is applied to backside surface 15 after the electrical circuitry has been formed.

FIG. 2 is a cross-sectional view showing a portion of wafer 10 including semiconductor die 20 in further detail. Note that semiconductor die 20 is shown in a "flip-chip" orientation which is reversed from the orientation of FIG. 1.

A plurality of conductive bumps 18 are formed on topside surface 14 for making electrical and mechanical connections between circuitry on topside surface 14 and a system circuit board (not shown in FIG. 2). Conductive bumps 18 typically are formed with a low temperature solder, plated copper or another conductive material suitable for making the necessary electrical and/or mechanical attachments without degrading the performance of circuitry formed on semiconductor die 20.

After the electrical circuitry and conductive bumps 18 are formed, coating material 16 is applied to backside surface 15 to produce an opaque appearance whose color contrasts with that of semiconductor die 20. Coating material 16 is selected to provide strong adhesion to the underlying semiconductor material while meeting specified reliability standards. Coating material 16 is formed with an organic material because pigments can be added to produce a desired color and because the amount and type of filler material can be varied to provide a specified temperature coefficient of expansion in order to minimize die or wafer stress. Coating material 16 may have an elastic or compliant characteristic to farther reduce stress on semiconductor die 20 under specified environmental and operating conditions. In one embodiment, coating material 16 comprises Hysol® to CNB876-36, a flexible epoxy resin with a silica filler material, available from Loctite Corporation, Industry, California. Coating material 16 may alternatively include a polymer.

Coating material 16 is configured, by adding pigments if necessary, to have a color that contrasts with the color of the semiconductor material visible at surface 15. In an embodiment in which semiconductor die 20 is formed of silicon, which has a color that is described as off-white or beige, coating material 16 is formed to have an opaque black color. Alternatively, coating material 16 may be formed to have virtually any other color that provides a good visual contrast with the off-white color of silicon.

Coating material 16 typically is applied in liquid form by screening through a mesh whose height determines the film thickness. The screen fabric may be stainless steel or polyester with a mesh count between about one hundred ten and about two hundred thirty. Coating material 16 is applied to have a thickness in a range of about five to about thirty-seven micrometers. In one embodiment, coating material 16 is about thirty micrometers thick, and is cured for thirty minutes at one hundred fifty degrees Celsius. Such a low curing temperature does not affect the functionality of devices formed on semiconductor die 20, and is lower than the reflow or melting temperature of solder.

Information is marked on backside surface 15 by directing a ray 30 of electromagnetic radiation to selectively remove material from coating material 16 to form openings 21 that expose portions of backside surface 15. In one embodiment, ray 30 comprises a laser beam which is programmed to produce openings 21 in the shape of alphanumeric characters or other symbols that represent the desired information. Parameters such as the current level of the laser device or beam intensity, pulse rate, beam diameter and scan time of the laser beam can be adjusted if desired to ensure that material from coating material 16 is completely removed while producing zero or only a minimal change to the structure of surface 15 of semiconductor die 20. Alternatively, openings 21 may be formed by applying a photoresist layer to coating material 16 and selectively etching to remove material. Alignment between topside surface 14 and backside surface 15, i.e., between openings 21 and semiconductor die 20, is achieved with a standard alignment tool.

Because the film thickness of coating material 16 is less than about thirty-seven micrometers, highly readable alphanumeric characters can be produced using character or font heights as small as about two-hundred fifty micrometers. Such small fonts allow more information to be provided, and is of particular importance if semiconductor die 20 has a small die area. The high contrast attributable to exposing portions of backside surface 15 makes the marked information discernible with little or no magnification.

Semiconductor die 20 is bounded by a saw street 22 which is used to singulate semiconductor die 20 from semiconductor wafer 10 after coating material 16 is cured and patterned.

FIG. 3 is a cross-sectional view showing the portion of wafer 10 in a second embodiment. Elements of the second embodiment have characteristics similar to those described in FIG. 2, except that after an opening 21A is formed in coating material 16, the intensity and/or pulse rate of ray 30 is increased to locally remove semiconductor material from backside surface 15 to form a recessed surface 17. Hence, when viewing opening 21A, both backside surface 15 and recessed surface 17 are visible. The semiconductor material removed by ray 30 produces a rougher texture for recessed surface 17 than the polished texture of backside surface 15. As a result, the perceived color of recessed surface 17 is different from the perceived color of backside surface 15, and a marking scheme with three discernible contrasting colors is produced, i.e., the colors of coating material 16, backside surface 15 and recessed surface 17. The additional color provided by recessed surface 17 provides an opportunity to convey additional information without significantly increasing the fabrication cost.

FIG. 4 shows a cross-sectional view of the portion of wafer 10 in a third embodiment that provides a different contrast level or an alternate color scheme. Coating material 16 has a multilayered or laminated structure that includes a coating layer 25 of a first color and a coating layer 26 of a second color that contrasts with the first color. For example, the first and second colors may be white and black, respectively, green and white, or any other combination of contrasting colors selected by adding pigments to coating layers 25–26 to convey information such as a colored logo of a manufacturer.

Note that in this embodiment, openings 21 are formed to remove material through coating layer 26 to expose a surface 27 of underlying coating layer 25 to achieve the desired contrast. Removal of material through coating layer 26 is achieved by adjusting the intensity of ray 30 and/or the time during which it is applied. Coating layers 25–26 typically are applied in successive laminations in a fashion similar to that described in FIG. 2 and cured concurrently. Coating layers 25–26 each have a thickness between about five micrometers and about eighteen micrometers. Alternatively, coating layers 25–26 are sequentially formed on a plastic sheet and subjected to a stage B cure so they can be handled without damage. The sheet is brought into contact with backside surface 15, applied using a laminating tool, heated to promote adhesion and then cured prior to forming openings 21.

FIG. 5 shows a cross-sectional view of the portion of wafer 10 in a fourth embodiment. In this embodiment, coating layer 16 comprises a coating layer 42 of a first color and a coating layer 40 of a second color that contrasts both with the first color and the color of semiconductor die 20 shown by surface 15. Hence, after patterning, three contrasting colors are visible, which can be used to provide a greater amount of desired information.

Coating layers 40 and 42 are applied in a fashion similar to that described in FIG. 4. Note that in this embodiment, openings 21 are formed by removing material through coating layer 40 to expose a surface 28 of coating layer 42, while openings 23 are formed by removing material from coating layer 40 to expose surface 15 of semiconductor die 20. This multiple layer approach is readily extended to utilize three or more coating layers of contrasting colors.

FIG. 6 shows an exploded view of an electrical system 70 including a system circuit board 60 and a semiconductor device 50 formed with semiconductor die 20 in accordance with the second alternate embodiment that includes coating layers 40 and 42 as described in FIG. 4. Circuit board 60 includes a mounting region 64 for mounting conductive bumps 18 of semiconductor device 50 to a plurality of conductive bonding pads 62.

Information pertaining to semiconductor device 50 is provided as described above by selectively removing material from coating layers 40 and 42 to expose surfaces 28 and 15, thereby providing viewable symbols and/or alphanumeric characters in multiple sharply contrasting colors. The alphanumeric characters shown in semiconductor device 50 are formed with a height of about two hundred fifty micrometers.

Examples of this information are shown in FIG. 5, and can include the enduser's or system manufacturer's identity or custom part number to reduce the inventory or other cost of semiconductor device 50. The semiconductor manufacturer's logo or other identification can be provided to facilitate communication in the event a defect is discovered in semiconductor device 50. Wafer and die processing information such as lot, wafer and die identification as well as part numbers and/or serial numbers allow a semiconductor manufacturer to trace semiconductor device 50 to specific processing steps in order to localize the source of a defect. Many defects can be associated with a particular processing step and often can be corrected by modifying the processing step, thereby improving the reliability of similarly processed devices and reducing the overall fabrication cost of the devices. In addition, information useful to an enduser or system manufacturer, such as the die orientation and/or location of a reference lead, i.e., pin "1", can be provided as well. In addition to alphanumeric characters, the enhanced contrast provided by the above described structures is also suitable for providing information in the form of machine readable symbols or bar codes.

Figure 7:
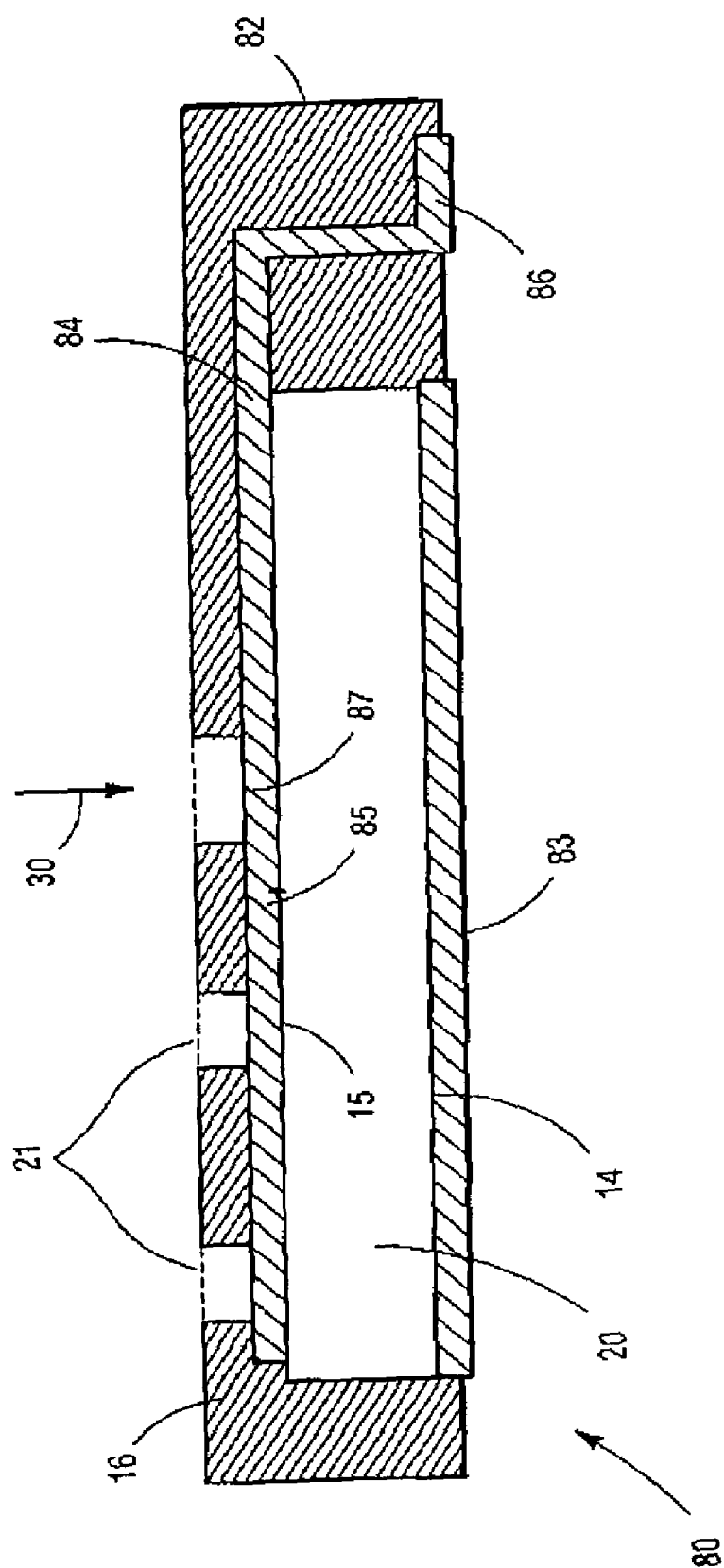
FIG. 7 is a cross-sectional view of the semiconductor die housed in a semiconductor package.

FIG. 7 is a cross-sectional view of a packaged semiconductor device 80 including semiconductor die 20 housed in a semiconductor package 82. Semiconductor die 20 is formed as a two-electrode device such as a diode whose dimensions are less than about 1.5 millimeters on a side, and has a vertical device structure with first and second electrodes respectively formed on surfaces 14 and 15.

Semiconductor package 80 is a low profile, surface mount package having first and second leads 83 and 84, respectively, arranged to form a nearly chip scale package. Leads 83 and 84 are formed with a highly conductive material such as copper or another metal. First lead 83 is electrically coupled on surface 14 to the first electrode. Second lead 84 includes an internal portion 85 electrically coupled on surface 15 to the first electrode and an external portion 86 for making external electrical connections. Package 80 includes an organic encapsulant 82 that protects semiconductor die 20 from environmental damage.

Encapsulant 82 is formed to a thickness less than about thirty-seven micrometers in a region overlying surface 87 of internal portion 85 to function as coating material 16. Coating material 16 is irradiated as described above to remove material to form openings 21 that expose portions of surface 87 to convey information pertaining to semiconductor device 80. Encapsulant 82 is made with an organic material such as an epoxy into which are introduced pigments if desired to produce a color that contrasts sharply with the color of surface 87. Note that depending on the application or type of package, openings 21 may be formed to expose other package surfaces such as a surface of a lead frame, die attach flag and the like.

In order to provide a significant amount of necessary information in the small amount of space available on package 80, openings 21 are configured with a small font size. Consequently, a sharp color contrast is particularly important in order to provide the high visibility needed to view the information.

In summary, a semiconductor device and method of providing information about the semiconductor device is described. A semiconductor die has a first surface for forming electronic circuitry. A coating layer whose color contrasts with a color of the semiconductor die is disposed on a second surface and patterned to expose the second surface to reveal information in the form of symbols or alphanumeric characters pertaining to the semiconductor device. The coating layer is patterned by directing radiation such as a programmed laser beam to remove the material through the coating layer. Epoxy resins, polymers, or a variety of other organic compositions can be used as coating materials to provide a desired level of contrast. The coating layer may be applied by screening, laminating, spraying, pouring, grafting, or another method. The overall thickness of the coating layer is made less than about thirty-seven micrometers in order to achieve a small font size, which increases the amount of highly discernible information that can be provided.

What is claimed is:

1. A semiconductor device, comprising:
   a semiconductor die having a first surface for forming electronic circuitry; and
   a coating layer disposed on a second surface of the semiconductor die to have a color that contrasts with a color of the semiconductor die, wherein the coating layer is patterned to expose a portion of the second surface to reveal information pertaining to the semiconductor device, and wherein the coating layer is patterned to form at least one opening that exposes the second surface of the semiconductor die, and wherein the semiconductor die has a recessed surface within the at least one opening that has a color different from a color of the second surface.

2. The semiconductor device of claim 1, wherein the coating layer is formed on the second surface to a thickness less than about thirty-seven micrometers.

3. The semiconductor device of claim 1, wherein the coating layer is formed with an organic material selected from the group consisting of an epoxy resin and a polymer.

4. The semiconductor device of claim 1, wherein the coating layer is opaque and has a black color.

5. The semiconductor device of claim 1, wherein the information includes an alphanumeric character having a height less than about three hundred micrometers.

6. The semiconductor device of claim 1, further comprising a conductive bump formed on the first surface of the semiconductor die for making an external electrical and mechanical connection.

7. A method of making a semiconductor device, comprising the steps of:
   disposing a coating layer over a surface of a semiconductor die;
   patterning the coating layer to expose the surface to provide information about the semiconductor device, and wherein the patterning step forms at least one opening that exposes the surface of the semiconductor die; and
   forming a recessed portion in the semiconductor die through the at least one opening so that the recessed portion has a color different from a color of the surface.

8. The method of claim 7, wherein the step of patterning includes the step of selectively irradiating the coating layer.

9. The method of claim 8, wherein the step of selectively irradiating includes the step of directing a laser beam to remove material from the coating layer.

10. The method of claim 9, wherein the step of directing includes the step of forming an alphanumeric character with a font height less than about three hundred micrometers in the coating layer.

11. The method of claim 7, wherein the step of disposing includes the step of forming the coating layer to a thickness of about thirty-seven micrometers.

12. The method of claim 7, further comprising the step of curing the coating layer at a temperature less than about one hundred seventy-five degrees Celsius.

13. The method of claim 7, wherein the step of disposing includes the step of applying the coating layer to a semiconductor wafer, further comprising the step of singulating the semiconductor wafer after the step of applying to form the semiconductor die.

14. A semiconductor device, comprising:
   a semiconductor die formed with an electrical component; and
   a semiconductor package having an organic material for encapsulating the semiconductor die, wherein openings are formed in the organic material to expose a conductive surface of the semiconductor package with a contrasting color to provide visible information pertaining to the semiconductor device.

15. The semiconductor device of claim 14, wherein the conductive surface is disposed on a lead of the semiconductor package.

* * * * *